(12) United States Patent
Boerner

(10) Patent No.: US 9,070,901 B2
(45) Date of Patent: Jun. 30, 2015

(54) OLED DEVICE WITH MACRO EXTRACTOR

(75) Inventor: Herbert Friedrich Boerner, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 618 days.

(21) Appl. No.: 12/934,700

(22) PCT Filed: Mar. 31, 2009

(86) PCT No.: PCT/IB2009/051352
§ 371 (c)(1),
(2), (4) Date: Sep. 27, 2010

(87) PCT Pub. No.: WO2009/122358
PCT Pub. Date: Oct. 8, 2009

(65) Prior Publication Data
US 2011/0012101 A1     Jan. 20, 2011

(30) Foreign Application Priority Data

Apr. 4, 2008   (EP) ...................................... 08103373

(51) Int. Cl.
*H01L 51/52*     (2006.01)
(52) U.S. Cl.
CPC .................................. *H01L 51/5271* (2013.01)
(58) Field of Classification Search
CPC .................................................. H01L 51/5271
USPC ........... 257/79, 98, 99; 362/307–309, 311.01, 362/311.02, 311.05
See application file for complete search history.

(56) References Cited

U.S. PATENT DOCUMENTS

| 5,269,977 A | 12/1993 | Nakahashi et al. |
| 6,504,981 B1 | 1/2003 | Morley et al. |
| 6,815,070 B1 | 11/2004 | Burkle et al. |
| 7,084,434 B2 * | 8/2006 | Erchak et al. .................... 257/98 |
| 2001/0033135 A1 | 10/2001 | Duggal et al. |
| 2004/0080264 A1 | 4/2004 | Ichikawa |
| 2006/0215958 A1 | 9/2006 | Yeo et al. |
| 2007/0241326 A1 * | 10/2007 | Kim et al. ........................ 257/40 |

FOREIGN PATENT DOCUMENTS

| CN | 101022155 A | 8/2007 |
| EP | 1385219 A1 | 1/2004 |

(Continued)

*Primary Examiner* — Laura Menz
*Assistant Examiner* — Candice Y Chan
(74) *Attorney, Agent, or Firm* — Meenakshy Chakravorty

(57) ABSTRACT

The invention relates to an OLED device with a stack comprising: a light emitting organic layer (2), a cathode layer (1), and a transparent anode layer (3), the organic layer (2) being arranged between the cathode layer (1) and the anode layer (3), wherein a macro extractor layer (5) is arranged on top of a transparent substrate (4), wherein the macro extractor in optical contact with the transparent substrate (4), and wherein the macro extractor (5) layer comprises a plurality of mirror surfaces which extend from the bottom to the top of the macro extractor layer (5), preferably embedded in a matrix which has a refractive index matching the one of the transparent substrate. Preferably, the macro extractor layer comprises a crash glass device with a pre-stressed crash glass pane (6) having air-filled cracks (9). Since these cracks (9) act as mirrors for the light emitted by the organic layer (2), trapping of light is avoided and, thus, light extraction from the device is enhanced.

13 Claims, 1 Drawing Sheet

(56) References Cited

FOREIGN PATENT DOCUMENTS

| | | |
|---|---|---|
| JP | H10189237 A | 7/1998 |
| JP | 11272212 | 10/1999 |
| JP | 2000148032 A | 5/2000 |
| JP | 2004012946 | 1/2004 |
| JP | 2004146122 A | 5/2004 |
| JP | 2005038837 A | 2/2005 |
| WO | 02065817 A1 | 8/2002 |

* cited by examiner

OLED DEVICE WITH MACRO EXTRACTOR

FIELD OF THE INVENTION

The invention relates to the field of OLED devices, and especially to the field of light extraction from OLED devices.

BACKGROUND OF THE INVENTION

In general, organic LEDs (OLEDs) consist of a very thin layer (approx. 100 nm) of organic substances on a glass substrate covered with an electrically conducting but optically transparent oxide, usually indium-tin oxide (ITO). ITO forms the anode and a layer of aluminum (approx. 100 nm) evaporated on the organic layer stack forms the cathode. When a voltage of typically 2 to 10 volts is applied between anode and cathode, the organic stack emits light.

However, most of the light generated in the OLED is not able to escape from the substrate into the air, due to waveguiding in the organic layers or in the glass. A better light extraction is therefore essential for an efficient operation of OLEDs.

SUMMARY OF THE INVENTION

It is the object of the invention to provide an OLED device with better light extraction features.

This object is achieved by an OLED device with a stack comprising: a light emitting organic layer, a cathode layer, and a transparent anode layer, the organic layer being arranged between the cathode layer and the anode layer, wherein the stack is arranged on a transparent substrate, wherein a macro extractor layer is arranged on top of the transparent substrate, the macro extractor layer being in optical contact with the substrate, and wherein the macro extractor layer comprises a plurality of mirror surfaces which extend in directions from bottom to top of the macro extractor layer.

The feature that one layer is arranged "on top" of another layer or "between" two other layers does not necessarily mean that these layers are in direct contact with each other. Further, the organic layer may comprise multiple organic layers and, furthermore, in general, additional layers may be provided between the layers described above.

Furthermore, the fact that the mirror surfaces extend in directions from bottom to top of the macro extractor layer does not mean that the mirror surfaces have to extend from bottom to top. However, according to a preferred embodiment of the invention, the mirror surfaces actually extend from the bottom surface to the top surface of the macro extractor layer.

Preferably, the mirror surfaces are embedded in a transparent medium with refractive index close or equal to the refractive index of the substrate. This matching of the refractive indices is helpful for the optical coupling between substrate and macro extractor.

Due to the mirror surfaces more light is extracted from the OLED device. In this context is has been found that the light generated in a typical prior art OLED device with an organic layer, a metal cathode, an ITO anode, a light guide and a glass substrate, is divided into the following fractions:
  about 30% of the light is trapped in the light guide formed by the organic layers and the ITO,
  about 20% is lost in the interaction with the metal cathode,
  about 50% enters the glass substrate, and
  from the glass, only 20% escape into the air.

Further, it has been found that the light entering the glass substrate is partially trapped due to internal reflection at the glass-air interface. This light is basically wave guided by the glass plate. The extractor according to the invention uses above describe mirror surfaces in order to reflect the wave guided light, thus, leading to suppression of conduction in the glass plate and, hence, a better extraction of the light is achieved.

According to a preferred embodiment of the invention, the mirror surfaces have an irregular surface structure. Further, according to a preferred embodiment of the invention, the mirror surfaces have different normal directions. With respect to this, according to a preferred embodiment of the invention, the normal directions of the mirror surfaces and the normal of the plane of the macro extractor layer have included acute angles of equal or less than 90° and more than 45°, preferably of more than 70°, and most preferred more than 80°. In other words, it is preferred that the mirror surfaces extend almost perpendicular to the plane of the macro extractor layer.

Further, according to a preferred embodiment of the invention, the mirror surfaces comprise spaces in the material of the macro extractor layer which are filled with a different material with a lower refractive index. With respect to this, it is preferred that the spaces are gas-filled, especially air filled. Furthermore, according to a preferred embodiment of the invention, the distance of adjacent mirror surfaces from each other is equal or less than 15 mm, preferably equal or less than 10 mm, and most preferably equal or less than 8 mm.

According to a preferred embodiment of the invention, the macro extractor layer comprises a crash glass device. Within the context of the present invention, a crash glass device is understood to be a device with at least one area of crashed glass, i.e. an area where the glass shows a crash structure. Such a crash structure comprises parts of unbroken glass which are separated from each other by cracks which are gas filled, typically air filled. Such a crash glass device generally comprises a glass pane which may comprise all of the above mentioned features of preferred embodiments of the invention. Especially, the mirror surfaces are formed by air filled cracks that separate unbroken parts of the glass pane from each other.

With regard to this, according to a preferred embodiment of the invention, the crash glass device comprises a, preferably pre-stressed, crash glass pane which is sandwiched between an upper and a lower stabilizing layer. The stabilizing layers preferably have refractive indices matching the refractive index of the crash glass pane, as well as the materials used to glue the pane and the layers.

Further, according to a preferred embodiment of the invention, one of the stabilizing layer is a foil layer, especially a thin plastic foil layer, while the other stabilizing layer comprises a glass pane, preferably a security glass pane. This way, the stabilizing layer on the side of the OLED can be made very thin which is advantageous with respect to the fact that rays emitted under high angles enter the crash glass with a minimum path length in the glass.

Moreover, it is preferred that the thickness of the crash glass pane is less or equal to 8 mm, preferably less or equal to 6 mm, and most preferably less or equal to 4 mm. Furthermore, according to a preferred embodiment of the invention, the crash glass pane comprises a low-absorption glass, i.e. preferably a glass that shows low absorption for the wavelength of the OLED.

In other words, according to a preferred embodiment of the invention a crashed pre-stressed glass sheet in optical contact to the OLED substrate is provided to reflect the wave guided light at the cracks which are roughly perpendicular to the surface. For such a crash glass, the cracks are not straight, but have small variations which randomize the light rays, leading to an essentially complete suppression of the light conduction in the glass plate and hence a better extraction into the air.

The cracks in the crash glass pane used for the preferred embodiment of the invention, partition the pane into small sections (length preferably less than 10 mm, most preferably several mm). The air filled cracks can provide 100% mirrors for light rays travelling along the plane of the glass, effectively prohibiting light propagation in this plane. A glass pane without the cracks would guide the light to the edges because of internal reflection.

The cracks are preferably more or less perpendicular to the surface of the glass, but they preferably show considerable irregularities in form of a waviness that randomize the light rays. This randomization is helpful to allow all light rays to escape the glass pane, since it will always shift light rays into the escape cone, which is the cone formed by all light rays in the substrate that hit the substrate-air interface under angles higher than the angle of total internal reflection.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
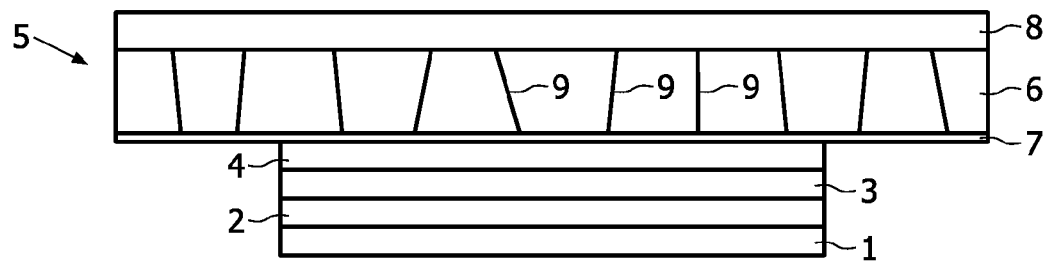
FIG. 1 schematically shows an OLED device with a macro extractor according to a preferred embodiment of the invention, and FIG. 2 schematically depicts the principle of the optical paths in the crash glass pane of the OLED device according to the preferred embodiment of the invention.

FIG. 1 shows an OLED device according to a preferred embodiment of the invention in a schematic depiction. As can be seen from FIG. 1, the OLED device according to the preferred embodiment of the invention comprises a stack with, from bottom to top, a metal cathode 1, a light emitting organic layer 2, a transparent anode 3 made of ITO and a glass substrate 4. This stack is essentially the same as known from prior art OLED devices.

However, on top of this stack, and in optical contact with this stack, a macro extractor 5 is provided which comprises a crash glass pane 6 which is sandwiched between a thin plastic foil 7 on the bottom side and a thicker stabilizing top pane 8. The stabilizing top pane 8 is provided for stabilizing the macro extractor 5 and is made of a security glass. For the crash glass pane 6, pre-stressed security glass is used which comprises air-filled cracks 9 which separate the crash glass pane in a plurality of areas of unbroken security glass.

These air-filled cracks 9 act as mirrors for light rays travelling along the plane of the crash glass pane 6, effectively prohibiting light propagation in this plane. A glass pane without the cracks would guide the light to the edges because of internal reflection. In contrast to that, according to the preferred embodiment of the invention, such light can still be extracted.

The cracks 9 are almost perpendicular to the surface of the crash glass pane 6 and show considerable irregularities in form of a waviness that randomize the light rays. This randomization is helpful to allow all light rays to escape the crash glass pane 6, since it will always shift light rays into the escape cone.

Figure 2:
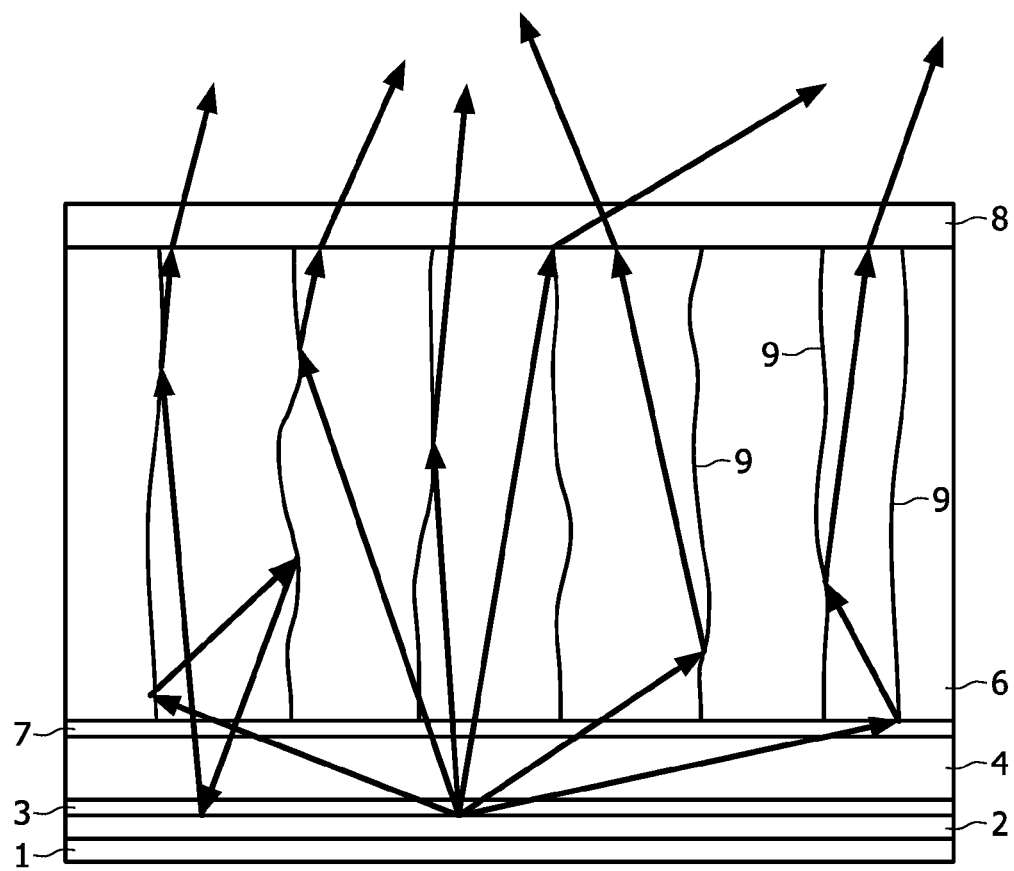

This is shown in more detail in FIG. 2. As can be seen from FIG. 2, light rays which are emitted under acute angles relative to the plane of the organic layer 2, are reflected at the cracks 9, partially even back reflected onto the metal cathode 1, and leave the device when their angle of incidence on the top surface of the crash glass pane 6 is essentially perpendicular. As a result, trapping of light rays due to total reflection is avoided which leads to a much better extraction of generated light.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. OLED device with a stack comprising: a light emitting organic layer, a cathode layer, and a transparent anode layer, the organic layer being arranged between the cathode layer and the anode layer, wherein the stack is arranged on a transparent substrate, wherein a macro extractor layer is arranged on top of the transparent substrate, the macro extractor layer being in optical contact with the substrate, and wherein the macro extractor layer comprises a plurality of mirror surfaces which extend in directions from bottom to top of the macro extractor layer, wherein the mirror surfaces have an irregular surface structure and wherein the mirror surfaces are cracks in material composing the macro extractor layer, and wherein the macro extractor layer comprises a crash glass device.

2. OLED device according to claim 1, wherein the mirror surfaces have different normal directions.

3. OLED device according to claim 2, wherein the normal directions of the mirror surfaces and the normal of the plane of the macro extractor layer have included acute angles of more than 70°.

4. OLED device according to claim 1, wherein the mirror surfaces comprise spaces in the material of the macro extractor layer which are filled with a different material.

5. OLED device according to claim 1, wherein the distance of mirror surfaces which are adjacent to each other is equal or less than 15 mm.

6. OLED device according to claim 1, wherein the crash glass device comprises pre-stressed, crash glass pane defining a plurality of air-filled cracks.

7. OLED device according to claim 6, wherein the crash glass pane is sandwiched between an upper stabilizing layer and a lower stabilizing layer.

8. OLED device according to claim 7, wherein one of the stabilizing layers is a foil layer in direct contact with a bottom surface of the crash glass device while the other stabilizing layer comprises a glass pane, preferably a security glass pane, in direct contact with a top surface of the crash glass device.

9. OLED device according to claim 6, wherein the thickness of the crash glass pane is less or equal to 8 mm.

10. OLED device according to claim 6, wherein the crash glass pane comprises a low-absorption glass.

11. OLED device according to claim 6, wherein the thickness of the crash glass pane is less or equal to 4 mm.

12. OLED device according to claim 1, wherein the distance of mirror surfaces which are adjacent to each other is equal or less than 8 mm.

13. OLED device with a stack comprising: a light emitting organic layer, a cathode layer, and a transparent anode layer, the organic layer being arranged between the cathode layer and the anode layer, wherein the stack is arranged on a transparent substrate, wherein a macro extractor layer is arranged on top of the transparent substrate, the macro extractor layer being in optical contact with the substrate, and wherein the macro extractor layer comprises a plurality of mirror surfaces which extend in directions from bottom to top of the macro extractor layer, wherein the mirror surfaces have an irregular surface structure and are disposed directly over the transparent anode layer, and wherein the macro extractor layer comprises a crash glass device.

* * * * *